US 11,158,599 B2

(12) United States Patent
Kazama et al.

(10) Patent No.: US 11,158,599 B2
(45) Date of Patent: Oct. 26, 2021

(54) METHOD FOR MANUFACTURING ELECTRONIC DEVICE (71) Applicants: SUMITOMO BAKELITE CO., LTD., Tokyo (JP); SENJU METAL INDUSTRY CO., LTD., Tokyo (JP)

(72) Inventors: Tatsuya Kazama, Tokyo (JP); Tomohisa Kawanago, Tokyo (JP); Takahiro Nishizaki, Tokyo (JP)

(73) Assignees: SUMITOMO BAKELITE CO., LTD., Tokyo (JP); SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/047,760

(22) PCT Filed: Apr. 8, 2019

(86) PCT No.: PCT/JP2019/015339
§ 371 (c)(1),
(2) Date: Oct. 15, 2020

(87) PCT Pub. No.: WO2019/203048
PCT Pub. Date: Oct. 24, 2019

(65) Prior Publication Data
US 2021/0143122 A1 May 13, 2021

(30) Foreign Application Priority Data
Apr. 16, 2018 (JP) .............. JP2018-078315

(51) Int. Cl.
H01L 23/00 (2006.01)
C08L 63/00 (2006.01)
(Continued)

(52) U.S. Cl.
CPC .............. H01L 24/81 (2013.01); B23K 1/008 (2013.01); B23K 35/362 (2013.01);
(Continued)

(58) Field of Classification Search
None
See application file for complete search history.

(56) References Cited

U.S. PATENT DOCUMENTS 8,070,043 B1 * 12/2011 Fleming ............... H05K 3/3489
228/180.21
8,430,295 B2 * 4/2013 Gallagher ............... H01L 24/81
228/180.21

(Continued)

FOREIGN PATENT DOCUMENTS

JP 2006-193595 A 7/2006
JP 2007-189210 A 7/2007
JP 2008-226926 A 9/2008

OTHER PUBLICATIONS

International Search Report, issued in PCT/JP2019/015339, PCT/ISA/210, dated May 28, 2019.
(Continued)

Primary Examiner — Devang R Patel
(74) Attorney, Agent, or Firm — Birch, Stewart, Kolasch & Birch, LLP (57) ABSTRACT The present invention provides a method for manufacturing an electronic device including a base material that has an exposed metal portion on a surface of the base material and an electronic component that is provided on the base material. The method includes a flux treatment step of treating the exposed metal portion with a flux by bringing the exposed metal portion into contact with the flux and an introduction step of introducing a resin composition such that the resin composition comes into contact with a surface of the exposed metal portion treated with the flux. The flux contains a rosin, an activator, and a solvent. The content of the rosin is equal to or greater than 1 part by mass and equal to or smaller than 18 parts by mass with respect to 100 parts by mass of the flux. The percent change in mass of the flux (Continued)

before and after a heating treatment is equal to or lower than 21% by mass. The resin composition contains an epoxy resin and a phenolic resin curing agent. In a case where SP1 represents a Hansen's method-based average solubility parameter of a resin group consisting of the epoxy resin and the phenolic resin curing agent in the resin composition, and Mn1 represents a number average molecular weight of the resin group, SP1 and Mn1 satisfy $Mn1 \leq 210 \times SP1 - 4,095$.

19 Claims, 3 Drawing Sheets

(51) Int. Cl.
- *B23K 1/00* (2006.01)
- *B23K 1/008* (2006.01)
- *B23K 35/36* (2006.01)
- *B23K 35/362* (2006.01)
- *C08L 93/04* (2006.01)
- *B23K 101/40* (2006.01)

(52) U.S. Cl.
CPC .......... *B23K 35/3613* (2013.01); *C08L 63/00* (2013.01); *C08L 93/04* (2013.01); *B23K 2101/40* (2018.08); *H01L 2224/81002* (2013.01); *H01L 2224/81024* (2013.01); *H01L 2224/81191* (2013.01); *H01L 2224/81815* (2013.01)

(56) References Cited

U.S. PATENT DOCUMENTS

| | | | |
|---|---|---|---|
| 2002/0031861 A1* | 3/2002 | Master | H05K 3/3489 |
| | | | 438/108 |
| 2007/0134844 A1 | 6/2007 | Katoh et al. | |
| 2008/0000549 A1* | 1/2008 | Sheng | B23K 35/362 |
| | | | 148/23 |
| 2015/0315436 A1* | 11/2015 | Fujimaru | C08L 93/04 |
| | | | 438/118 |
| 2016/0228999 A1* | 8/2016 | Shimizu | H01L 24/13 |

OTHER PUBLICATIONS

Written Opinion of the International Searching Authority, issued in PCT/JP2019/015339, PCT/ISA/237, dated May 28, 2019.

* cited by examiner

METHOD FOR MANUFACTURING ELECTRONIC DEVICE

TECHNICAL FIELD

The present invention relates to a method for manufacturing an electronic device.

BACKGROUND ART

For example, in the conventional semiconductor device manufacturing process described in Patent Document 1, usually, a semiconductor element and a substrate are connected using a flux agent during reflow soldering, then the assembly is cleaned with a solvent such that the residual flux agent on the base material is removed, and then the semiconductor element is sealed using a resin composition for semiconductor sealing.

RELATED DOCUMENT

Patent Document

[Patent Document 1] Japanese Laid-Open Patent Publication No. 2008-226926

SUMMARY OF THE INVENTION

Technical Problem

In the method for manufacturing an electronic device, a step of cleaning flux residues on a base material with a solvent may reduce the productivity of the electronic device.

However, in a case where the step of cleaning flux residues is not performed, the flux residues remain between a cured product of the resin composition and the base material in the electronic device. In a case where the base material, on which the flux residues remain, including a copper circuit is sealed with the resin composition, the adhesiveness between the cured product of the resin composition and the base material deteriorates. As a result, sometimes the electrical reliability of the electronic device is reduced.

Therefore, whether or not the step of cleaning flux residues with a solvent is performed, the method for manufacturing an electronic device needs to be improved in terms of either the productivity of the electronic device or the manufacturing stability.

Solution to Problem

Therefore, in order to improve the productivity of the electronic device by not performing the step of cleaning flux residues on the base material with a solvent, the inventors of the present invention kept studying a method for manufacturing an electronic device in which the flux residues between the cured product of the resin composition and the base material are reduced. Specifically, the inventors studied a method of removing flux residues even though a solvent is not used for cleaning the flux residues.

As a result of intensive studies, the inventors have found that in a case where a flux and a resin composition are used in combination, flux residues can be removed by being incorporated into the resin composition, in which the flux contains a specific amount of rosin and undergoes a small percent change in mass before and after a heating treatment, and a Hansen's method-based average solubility parameter SP1 of a resin group consisting of an epoxy resin and a phenolic resin curing agent and a number average molecular weight Mn1 of the resin group satisfy a predetermined relationship in the resin composition.

Although the detailed mechanism unclear, it is considered that in a case where the flux and resin composition described above are used, the compatibility between the flux and the resin composition may be improved, and thus the flux residues may be removed by being incorporated into the resin composition.

Based on the finding, the inventors of the present invention have also found that because the flux residues can be removed using the flux and the resin composition in combination, the deterioration of adhesiveness between the cured product of the resin composition and the base material can be inhibited, and the manufacturing stability of the electronic device is improved. Based on the knowledge, the inventors have accomplished the present invention.

According to the present invention, there is provided a method for manufacturing an electronic device including a base material having an exposed metal portion on a surface of the base material and an electronic component that is provided on the base material, the method including a flux treatment step of treating the exposed metal portion with a flux by bringing the exposed metal portion into contact with the flux, and an introduction step of introducing a resin composition such that the resin composition comes into contact with a surface of the exposed metal portion treated with the flux, in which the flux contains a rosin, an activator, and a solvent, a content of the rosin is equal to or greater than 1 part by mass and equal to or smaller than 18 parts by mass with respect to 100 parts by mass of the flux, a percent change in mass of the flux that is measured before and after a heating treatment by the following procedure is equal to or lower than 21% by mass, (Procedure)

a heating treatment is performed on the flux in a nitrogen atmosphere under a heating condition in which the flux is heated to 250° C. from 25° C. at a heating rate of 10° C./min, a mass M1 of the flux before the heating treatment and a mass M2 of the flux after the heating treatment are measured using a thermogravimetric analyzer, and then a percent change in mass of the flux before and after the heating treatment is calculated based on Equation: $(M2/M1) \times 100$ by using the obtained M1 and M2, the resin composition contains an epoxy resin and a phenolic resin curing agent, and in a case where SP1 represents a Hansen's method-based average solubility parameter of a resin group consisting of the epoxy resin and the phenolic resin curing agent in the resin composition, and Mn1 represents a number average molecular weight of the resin group consisting of the epoxy resin and the phenolic resin curing agent, SP1 and Mn1 satisfy $Mn1 \leq 210 \times SP1 - 4,095$.

Advantageous Effects of Invention

According to the present invention, it is possible to provide a method for manufacturing an electronic device excellent in productivity and manufacturing stability.

BRIEF DESCRIPTION OF THE DRAWINGS

The object described above and other objects, features, and advantages will be further clarified by the suitable embodiments that will be described below and the following accompanying drawings.

DESCRIPTION OF EMBODIMENTS

Hereinafter, embodiments of the present invention will be described using drawings. In all the drawings, the same constituents will be marked with the same reference signs such that the constituents will not be described as appropriate.

The method for manufacturing an electronic device according to the present embodiment includes a base material having an exposed metal portion on a surface of the base material and an electronic component provided on the base material. The method for manufacturing an electronic device includes a flux treatment step of treating the exposed metal portion with a flux by bringing the exposed metal portion into contact with the flux and an introduction step of introducing a resin composition such that the resin composition comes into contact with a surface of the exposed metal portion treated with the flux.

The flux used in the flux treatment step contains a rosin, an activator, and a solvent. The content of the rosin in the flux is equal to or greater than 1 part by mass and equal to or smaller than 18 parts by mass with respect to 100 parts by mass of the flux. The percent change in mass of the flux before and after a heating treatment that is measured by the following procedure is equal to or lower than 21% by mass.

(Procedure)

A heating treatment is performed on the flux in a nitrogen atmosphere under a heating condition in which the flux is heated to 250° C. from 25° C. at a heating rate of 10° C./min, and a mass M1 of the flux before the heating treatment and a mass M2 of the flux after the heating treatment are measured using a thermogravimetric analyzer. Then, the percent change in mass of the flux before and after the heating treatment is calculated based on Equation: (M2/M1)×100 by using the obtained M1 and M2.

The resin composition used in the introduction step contains an epoxy resin and a phenolic resin curing agent. In a case where SP1 represents a Hansen's method-based average solubility parameter of a resin group consisting of the epoxy resin and the phenolic resin curing agent in the resin composition, and Mn1 represents a number average molecular weight of the resin group consisting of the epoxy resin and the phenolic resin curing agent, SP1 and Mn1 satisfy the relationship of $Mn1 \leq 210 \times SP1 - 4,095$.

Conventionally, in a method for manufacturing an electronic device, in a case where a step of cleaning flux residues is not performed, sometimes the flux residues remain between a base material and a cured product of a resin composition in the electronic device.

First, the cause of the formation of flux residues will be described.

The flux is a resin-based flux containing a rosin, an activator, and a solvent.

In a case where the flux is applied to a metal member such as an electric circuit of the electronic device, the rosin and activator in the flux react with an oxide film formed on the surface of the metal member, and thus the oxide film is removed. As a result, solder can more tightly adhere to the metal member from which the oxide film has been removed than to a metal member on which the oxide film is present.

Herein, the rosin and activator that have not reacted with the oxide film remain on the surface of the metal member. The residual rosin and activator then form flux residues.

The rosin turns into thermally modified rosin through a thermal treatment during soldering in an electronic device preparation process. The thermally modified rosin is designed to exhibit low affinity with water and have insulating properties so as to inhibit a metal member from being negatively influenced by corrosion, short circuit, and the like. The thermally modified rosin has a low chemical affinity with the conventional resin composition. Presumably, this is because the thermally modified rosin has low affinity with water, although the detailed mechanism is unclear. Incidentally, the thermally modified rosin is porous.

For the reason described above, the conventional resin composition having low chemical affinity cannot permeate into the thermally modified porous rosin. Presumably, therefore, the flux residues may be incompatible with the conventional resin composition.

The activator is decomposed through a thermal treatment during soldering in an electronic device preparation process.

Incidentally, lead-free solders used in recent years contain metals such as tin (Sn). Presumably, the decomposed activator may react with a metal such as Sn contained in solder or with a metal such as Ag, Fe, or Ni derived from a metal member and form crystals of the metal, although the detailed mechanism is unclear. As a result, the friction in the flux increases, and the viscosity of the flux increases. In a case where the viscosity of the flux increases in this way, the molecular chain of the flux and the molecular chain of the resin composition are not intertwined with each other, and hence the physical affinity is reduced.

As described above, the conventional resin composition having a low physical affinity is not intertwined with the molecular chain of the flux. Presumably, therefore, the flux residues may be incompatible with the conventional resin composition.

The inventors of the present invention have studied a method of removing flux residues on the premise that a step of cleaning the flux residues is not performed. As a result, the inventors have found that it is effective to use the aforementioned flux in combination with a resin composition in which a specific relationship is established between a Hansen's method-based average solubility parameter SP1 of a resin group consisting of an epoxy resin and a phenolic resin curing agent and a number average molecular weight Mn1 of the resin group. Presumably, in a case where the flux and the resin composition are used in combination as described above, the compatibility such as chemical affinity and physical affinity between the flux and the resin composition may be improved. Therefore, in a case where the resin composition is introduced, the flux and the resin composition are compatible with each other, and it is possible to remove the flux residues without cleaning the flux residues.

As described above, the electronic device according to the present embodiment can provide the method for manufacturing an electronic device in which no flux residue is present between a cured product of a resin composition and a base material, based on the premise that a step of cleaning the flux residues on the base material is not performed. By the manufacturing method, the adhesiveness between the cured product of the resin composition and the base material can be improved, and the performance such as electrical reliability of the electronic device can be improved. As a result, a method for manufacturing an electronic device excellent in productivity and manufacturing stability can be actualized.

First, the resin composition and flux used in the method for manufacturing an electronic device according to the present embodiment will be described.

(Resin Composition)

The resin composition according to the present embodiment is a thermosetting resin composition containing an epoxy resin and a phenolic resin curing agent.

In the resin composition according to the present embodiment, the relationship of Mn1≤210×SP1−4,095 is established between a Hansen's method-based average solubility parameter SP1 of a resin group consisting of the epoxy resin and the phenolic resin curing agent and a number average molecular weight Mn1 of the resin group consisting of the epoxy resin and the phenolic resin curing agent. In a case where the resin composition satisfies the above relationship, the resin composition is compatible with the flux, and the flux residues can be removed.

First, the Hansen's method-based average solubility parameter SP1 of the aforementioned resin group will be described.

The Hansen's method is a method of dividing the energy of evaporation into a dispersion energy dD, a polar energy dP, and a hydrogen bonding energy dH, and calculating vector lengths of dD, dP, and dH as solubility parameters by treating dD, dP, and dH as three-dimensional vectors.

The average solubility parameter SP1 can be calculated by the following Equation 1.

$$\text{Average solubility parameter} SP1 = \Sigma(A_{(n)} \times Ca_{(n)}) + \Sigma(B_{(m)} \times Cb_{(m)}) \quad \text{(Equation 1)}$$

(In the Equation 1, $A_{(n)}$ represents a solubility parameter calculated for each of n kinds of epoxy resins contained in the present resin composition based on the Hansen's method. $Ca_{(n)}$ represents a content of each of n kinds of epoxy resins with respect to the total content of all epoxy resins and all phenolic resin curing agents in the present resin composition. $B_{(m)}$ represents to a solubility parameter calculated for each of m kinds of phenolic resin curing agents contained in the present resin composition based on the Hansen's method. $Cb_{(m)}$ represents a content of each of m kinds of phenolic resin curing agents with respect to the total content of all epoxy resins and all phenolic resin curing agents in the present resin composition. Each of n and m is an integer equal to or greater than 1.)

For example, a case where the resin group consists of a first epoxy resin, a second epoxy resin, a first phenolic resin curing agent, and a second phenolic resin curing agent will be considered. In this case, the average solubility parameter SP1 of the resin group is calculated by the following Equation 2.

$$\text{Average solubility parameter} SP1 = A_1 \times Ca_1 + A_2 \times Ca_2 + B_1 \times Cb_1 + B_2 \times Cb_2 \quad \text{(Equation 2)}$$

(In the Equation 2, $A_1$ represents a value of solubility parameter calculated for the first epoxy resin based on the Hansen's method. $A_2$ represents a value of solubility parameter calculated for the second epoxy resin based on the Hansen's method. $B_1$ represents a value of solubility parameter calculated for the first curing agent based on the Hansen's method. $B_2$ represents a value of solubility parameter calculated for the second curing agent based on the Hansen's method. $Ca_1$ represents a content of the first epoxy resin with respect to the total amount of the resin group. $Ca_2$ represents a content of the second epoxy resin with respect to the total amount of the resin group. $Cb_1$ represents a content of the first curing agent with respect to the total amount of the resin group. $Cb_2$ represents a content of the second curing agent with respect to the total amount of the resin group.)

The upper limit of the average solubility parameter SP1 of the resin group is, for example, preferably equal to or lower than 30.0 $[\text{cal/cm}^3]^{0.5}$, more preferably equal to or lower than 28.0 $[\text{cal/cm}^3]^{0.5}$, even more preferably equal to or lower than 26.0 $[\text{cal/cm}^3]^{0.5}$, and particularly preferably equal to or lower than 24.0 $[\text{cal/cm}^3]^{0.5}$. In a case where the upper limit of SP1 is within the above range, the interaction such as hydrogen bonding or dipole-dipole interaction between the rosin or the active species contained in the flux residues and the functional group contained in the molecular structure of the epoxy resin or the phenolic resin curing agent is facilitated, and hence the compatibility between the flux residues and the resin composition can be improved. Specifically, it is considered that in a case where the value of SP1 is equal to or smaller than the upper limit described above, the interaction between molecular chains of the epoxy resin and the phenolic resin curing agent may weaken and substantially become the same as the interaction between the molecules of the flux residues, and as a result, the interaction between the flux residues and the resin composition may become stronger and hence the compatibility therebetween may be improved.

The lower limit of the average solubility parameter SP1 of the resin group is, for example, preferably equal to or higher than 20.8 $[\text{cal/cm}^3]^{0.5}$, and more preferably equal to or higher than 21.0 $[\text{cal/cm}^3]^{0.5}$. In a case where the upper limit of SP1 is within the above range, the interaction such as hydrogen bonding or dipole-dipole interaction between the rosin or the active species contained in the flux residues and the functional group contained in the molecular structure of the epoxy resin or the phenolic resin curing agent is facilitated, and hence the compatibility between the flux residues and the resin composition can be improved. Specifically, it is considered that in a case where the value of SP1 is equal to or greater than the lower limit described above, the interaction between molecular chains of the epoxy resin and the phenolic resin curing agent may become stronger and substantially become the same as the interaction between the molecules of the flux residues, and as a result, the interaction between the flux residues and the resin composition may become stronger and hence the compatibility therebetween may be improved.

As described above, in a case where the value of the aforementioned average solubility parameter SP1 is controlled and fall into the above range of numerical values, the compatibility between the resin composition and the flux residues can be improved.

The method for calculating the number average molecular weight Mn1 of the resin group consisting of the epoxy resin and the phenolic resin curing agent will be described.

Specifically, the number average molecular weight Mn1 of the resin group can be calculated by the following Equation 3.

$$\text{Number average molecular weight} Mn1 = \Sigma(a_{(n)} \times Ca_{(n)}) + \Sigma(b_{(m)} \times Cb_{(m)}) \quad \text{(Equation 3)}$$

(In the above Equation 3, $a_{(n)}$ represents a value of number average molecular weight of each of n kinds of epoxy resins contained in the present resin composition. $Ca_{(n)}$ represents a content of each of n kinds of epoxy resins with respect to the total content of all epoxy resins and all phenolic resin curing agents in the present resin composition. $b_{(m)}$ represents a value of number average molecular weight of each of the m kinds of phenolic resin curing agents contained in the present resin composition. $Cb_{(m)}$ represents a content of each of m kinds of phenolic resin curing agents with respect to the total content of all epoxy resins and all phenolic resin curing agents in the present resin composition. Each of n and m is an integer equal to or greater than 1.)

For example, a case where the resin group contained in the resin composition according to the present embodiment consists of a first epoxy resin, a second epoxy resin, a first phenolic resin curing agent, and a second phenolic resin curing agent will be considered. In this case, the number average molecular weight Mn1 of the resin group is calculated by the following Equation 4.

Number average molecular weight $Mn1 = a_1 \times Ca_1 + a_2 \times Ca_2 + b_1 \times Cb_1 + b_2 \times Cb_2$ (Equation 4)

(In the Equation 4, $a_1$ represents a number average molecular weight of the first epoxy resin. $a_2$ represents a number average molecular weight of the second epoxy resin. $b_1$ represents a number average molecular weight of the first phenolic resin curing agent. $b_2$ represents a number average molecular weight of the second phenolic resin curing agent. $Ca_1$ represents a content of the first epoxy resin with respect to the total amount of the resin group. $Ca_2$ represents a content of the second epoxy resin with respect to the total amount of the resin group. $Cb_1$ represents a content of the first phenolic resin curing agent with respect to the total amount of the resin group. $Cb_2$ represents a content of the second phenolic resin curing agent with respect to the total amount of the resin group.)

The lower limit of the number average molecular weight Mn1 of the resin group is, for example, preferably equal to or greater than 250, more preferably equal to or greater than 260, and even more preferably equal to or greater than 265. In a case where the lower limit of Mn1 is within the above range, the interaction between the rosin or the active species contained in the flux residues and the main chain constituting the molecular structure of the epoxy resin or the phenolic resin curing agent is facilitated, and hence the compatibility between the flux residues and the resin composition can be improved. Specifically, in a case where the number average molecular weight Mn1 is equal to or greater than the lower limit described above, more molecular chains of the epoxy resin and the phenolic resin curing agent are intertwined with each other. As a result, the mobility of the molecular chains of the epoxy resin and the phenolic resin curing agent is restricted. It is considered that accordingly, the flux residues may more easily interact with the epoxy resin and the phenolic resin curing agent, and hence the compatibility could be improved.

The upper limit of the number average molecular weight Mn1 of the resin group is, for example, preferably equal to or smaller than 550, and more preferably equal to or smaller than 520. In a case where the lower limit of Mn1 is within the above range, the interaction between the rosin or the active species contained in the flux residues and the main chain constituting the molecular structure of the epoxy resin or the phenolic resin curing agent is facilitated, and hence the compatibility between the flux residues and the resin composition can be improved.

In order to obtain a resin composition that is compatible with the flux residues and enables the flux residues to be incorporated into a sealing material, the inventors of the present invention have studied the intertwinement between the epoxy resin and the phenolic resin curing agent in the resin composition. As a result, the inventors have found that in a case where SP1 which shows the chemical affinity of a molecular chain such as hydrogen bonding, dispersion energy, and dipole-dipole interaction and Mn1 which shows the physical affinity such as the shape of the molecular chain are each in a specific range of numerical values, the resin composition and the flux residues are compatible with each other.

Figure 1:
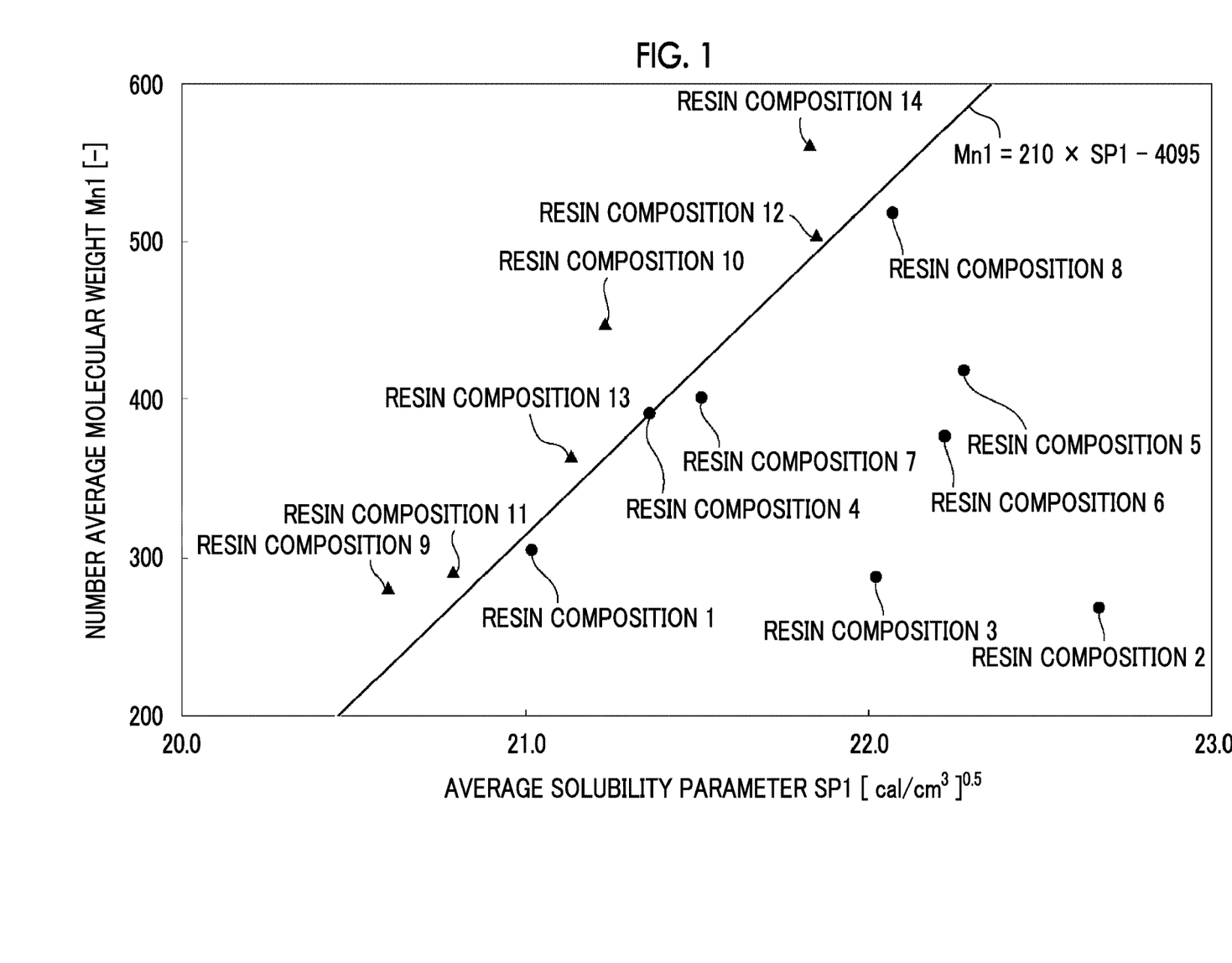
FIG. 1 is a plot showing the relationship between an average solubility parameter SP1 of a resin group consisting of an epoxy resin and a phenolic resin curing agent and a number average molecular weight Mn of the resin group in resin compositions 1 to 14 according to examples and comparative examples.

Regarding the specific range of numerical values, specifically, it is preferable that the number average molecular weight Mn1 is small and the average solubility parameter SP1 is high such that the relationship of $Mn1 \leq 210 \times SP1 - 4,095$ is satisfied. That is, in a case where Mn1 is plotted for SP1 as shown in FIG. 1, it is preferable that Mn1 is on the line of $Mn1 = 210 \times SP1 - 4,095$ or smaller than $210 \times SP1 - 4,095$ or SP1 is larger than $210 \times SP1 - 4,095$. In the relational expression of $Mn1 \leq 210 \times SP1 - 4,095$, the unit of Mn1 is dimensionless, and the unit of SP1 is $[cal/cm^3]^{0.5}$.

In a case where the relational expression of $Mn1 \leq 210 \times SP1 - 4,095$ is satisfied, the resin composition and the flux residues are compatible with each other. Although the detailed mechanism is unclear, the reason is assumed to be as below.

First, presumably, in a case where the value of Mn1 is reduced, the intertwinement between the molecular chains of the epoxy resin and the phenolic resin curing agent may be appropriately controlled. As a result, the physical affinity of the molecular chains of the epoxy resin and the phenolic resin curing agent with the molecular chains of the rosin and the active species contained in the flux residues is improved, and the compatibility is improved.

Furthermore, presumably, in a case where the value of SP1 is increased, the chemical affinity of the molecular chains of the epoxy resin and the phenolic resin curing agent with the molecular chains of the flux residues could be improved. In the conventional resin composition used for sealing electronic devices, the interaction between the molecular chains of the flux residues is much stronger than the interaction between the molecular chains of the epoxy resin and the phenolic resin curing agent and the molecular chains of the flux residues. However, in a case where the chemical affinity of the molecular chains of the epoxy resin and the phenolic resin curing agent with the molecular chains of the flux residues is enhanced, it is easy for the molecular chains contained in the flux residues to be incorporated into the molecular chains of the epoxy resin and the phenolic resin curing agent.

Presumably, in a case where both the Mn1 and SP1 are in an appropriate range of numerical values as described above, the resin composition and the flux residues may be compatible with each other.

The inventors of the present invention studied the method for obtaining a resin composition satisfying the relational expression of $Mn1 \leq 210 \times SP1 - 4,095$. As a result, the inventors have found that appropriately selecting the epoxy resin and the phenolic resin curing agent constituting the resin group is one of the examples of important factors. Herein, in selecting the epoxy resin and the phenolic resin curing agent, specifically, the combination and content of the epoxy resin and the phenolic resin curing agent is an example of the factor for the resin composition to satisfy the relational expression.

As the relationship between SP1 and Mn1, for example, the relationship of $210 \times SP1 - 5,000$ Mn1 may be additionally established.

Next, the components contained in the resin composition according to the present embodiment will be described.

The resin composition according to the present embodiment contains an epoxy resin and a phenolic resin curing agent.

(Epoxy Resin)

As the epoxy resin according to the present embodiment, all of the monomers, oligomers, and polymers having two or more epoxy groups in one molecule can be used, and the molecular weight and molecular structure thereof are not particularly limited.

Specifically, examples of the epoxy resin include a biphenyl-type epoxy resin; a bisphenol-type epoxy resin such as a bisphenol A-type epoxy resin, a bisphenol F-type epoxy resin, or a tetramethylbisphenol F-type epoxy resin; a stilbene-type epoxy resin; a novolac type epoxy resin such as a phenol novolac-type epoxy resin or a cresol novolak-type epoxy resin; a polyfunctional epoxy resin such as a triphenyl-type epoxy resin including, for example, a triphenylmethane-type epoxy resin, a triphenolmethane-type epoxy resin, or an alkyl-modified triphenolmethane-type epoxy resin; a phenol aralkyl-type epoxy resin such as a phenol aralkyl-type epoxy resin having a phenylene skeleton, a naphthol aralkyl-type epoxy resin having a phenylene skeleton, a phenol aralkyl-type epoxy resin containing a biphenylene skeleton (biphenyl aralkyl-type epoxy resin), or a naphthol aralkyl-type epoxy resin containing a biphenylene skeleton; a naphthol-type epoxy resin such as a dihydroxynaphthalene-type epoxy resin or an epoxy resin obtained by the glycidyl etherification of a dihydroxynaphthalene dimer; a triazine nucleus-containing epoxy resin such as triglycidyl isocyanurate or monoallyl diglycidyl isocyanurate; a bridged cyclic hydrocarbon compound-modified phenolic epoxy resin such as dicyclopentadiene-modified phenolic epoxy resin; and the like. As the epoxy resin, among the above specific examples, one kind of epoxy resin can be used singly, or two or more kinds of epoxy resins can be used in combination. As the epoxy resin, among the above examples, for example, it is preferable to use one kind of epoxy resin or two or more kinds of epoxy resins selected from the group consisting of the biphenyl-type epoxy resin, the polyfunctional epoxy resin, the phenol aralkyl-type epoxy resin, and the bisphenol-type epoxy resin. In a case where the above epoxy resin is used, the average solubility parameter SP1 can be increased, and hence the compatibility between the resin composition and the flux can be improved.

The lower limit of the content of the epoxy resin in the resin composition with respect to the total solid content (100 parts by mass) of the resin composition is, for example, preferably equal to or greater than 2 parts by mass, more preferably equal to or greater than 4 parts by mass, and even more preferably equal to or greater than 6 parts by mass.

Furthermore, the upper limit of the content of the epoxy resin in the resin composition with respect to the total solid content (100 parts by mass) of the resin composition is, for example, preferably equal to or smaller than 20 parts by mass, more preferably equal to or smaller than 15 parts by mass, and even more preferably equal to or smaller than 12 parts by mass.

In a case where the content of the epoxy resin is within the above range of numerical values, it is possible to make the average solubility parameter SP1 fall into the desired range of numerical values while satisfying the number average molecular weight Mn1 described above.

In the present embodiment, the total solid content of the resin composition means all the components contained in the resin composition except for solvents.

(Phenolic Resin Curing Agent)

The phenolic resin curing agent according to the present embodiment refers to all the monomers, oligomers, and polymers having two or more phenolic hydroxyl groups in one molecule, and the molecular weight and molecular structure of the phenolic resin curing agent are not particularly limited.

Specifically, examples of the phenolic resin curing agent include a novolac-type phenolic resin such as a phenol novolac resin, a cresol novolac resin, a trisphenol methane-type phenol novolac resin, or a naphthol novolac resin; a polyfunctional phenolic resin such as a triphenol methane-type phenol resin; a modified phenolic resin such as a terpene-modified phenolic resin, a formaldehyde-modified triphenylmethane-type phenolic resin, a formaldehyde-modified trihydroxyphenylmethane-type phenolic resin, or a dicyclopentadiene-modified phenolic resin; an aralkyl-type phenolic resin such as a phenol aralkyl resin having a phenylene skeleton and/or a biphenylene skeleton, a naphthol aralkyl resin having a phenylene skeleton and/or a biphenylene skeleton, a phenyl aralkyl-type phenolic resin, or a biphenyl aralkyl-type phenolic resin; a bisphenol compound such as bisphenol A or bisphenol F; and the like. As the phenolic resin curing agent, among the above specific examples, one kind of phenolic resin curing agent can be used singly, or two or more kinds of phenolic resin curing agents can be used in combination. As the phenolic resin curing agent, among the above specific examples, for example, it is preferable to use one kind of phenolic resin curing agent or two or more kinds of phenolic resin curing agents selected from the group consisting of the novolac-type phenolic resin, the polyfunctional phenolic resin, and the aralkyl-type phenolic resin. In a case where the above epoxy resin is used, the average solubility parameter SP1 can be increased, and hence the compatibility between the resin composition and the flux can be improved.

The lower limit of the content of the phenolic resin curing agent in the resin composition with respect to the total solid content (100 parts by mass) of the resin composition is, for example, preferably equal to or greater than 2 parts by mass, and more preferably equal to or greater than 3 parts by mass.

Furthermore, the upper limit of the content of the phenolic resin curing agent in the resin composition with respect to the total solid content (100 parts by mass) of the resin composition is, for example, preferably equal to or smaller than 20 parts by mass, more preferably equal to or smaller than 15 parts by mass, even more preferably equal to or smaller than 12 parts by mass, and still more preferable equal to or smaller than 10 parts by mass.

In a case where the content of the phenolic resin curing agent is within the above range of numerical values, it is possible to make the average solubility parameter SP1 fall into the desired range of numerical values while satisfying the number average molecular weight Mn1 described above.

(Other Components)

If necessary, the resin composition according to the present embodiment can be appropriately mixed with one kind of component or two or more kinds of components among various additives such as a curing accelerator, a filler, a coupling agent, a release agent, a colorant, a flame retardant, an ion scavenger, and a stress reducer.

Hereinafter, typical components will be described.

(Curing Accelerator)

The curing accelerator is not limited as long as it accelerates the curing reaction of the epoxy resin and the curing agent, and can be selected according to the types of the epoxy resin and the curing agent.

Specifically, examples of the curing accelerator include a phosphorus atom-containing compound such as an onium salt compound, an organic phosphine like triphenylphosphine, a tetrasubstituted phosphonium compound, a phosphobetaine compound, an adduct of a phosphine compound and a quinone compound, or an adduct of a phosphonium compound and a silane compound; an imidazole compound such as 2-methylimidazole, 2-ethyl-4-methylimidazole (EMI24), 2-phenyl-4-methylimidazole (2P4MZ), 2-phenylimidazole (2PZ), 2-phenyl-4-methyl-5-hydroxyimidazole (2P4MHZ), or 1-benzyl-2-phenylimidazole (1B2PZ); an amidine or tertiary amine such as 1,8-diazabicyclo[5.4.0]undecene-7 or benzyldimethylamine; a nitrogen atom-containing compound such as a quaternary ammonium salt of the aforementioned amine or tertiary amine; and the like. As the curing accelerator, among the above specific examples, one kind of curing accelerator can be used singly, or two or more kinds of curing accelerators can be used in combination.

(Filler)

The resin composition according to the present embodiment may further contain, for example, a filler. The filler is not limited, and an appropriate filler can be selected according to the structure of the electronic device and the mechanical strength and thermal characteristics required for the electronic device.

Specifically, examples of the filler include silica such as fused and crushed silica, fused spherical silica, crystalline silica, secondary aggregate silica, or spherical fine powder silica; a metal compound such as alumina, silicon nitride, aluminum nitride, boron nitride, titanium oxide, silicon carbide, aluminum hydroxide, magnesium hydroxide, or titanium white; talc; clay; mica; glass fiber; and the like. As the filler, among the above specific examples, one kind of filler can be used singly, or two or more kinds of fillers can be used in combination. As the filler, for example, it is preferable to use silica among the above specific examples. In a case where the above filler is used, the filler and an adhesion aid interact with each other, and hence the adhesiveness can be further improved.

In the present embodiment, the lower limit of the volume-based cumulative 50% particle size ($D_{50}$) of the filler is, for example, preferably equal to or greater than 0.1 μm, more preferably equal to or greater than 0.3 μm, even more preferably equal to or greater than 0.5 μm, and still preferably equal to or greater than 1 μm. In a case where the lower limit of $D_{50}$ of the filler is within the above range, the viscosity of the resin composition can be improved. As a result, in introducing the resin composition, the flux is more suitably incorporated into the resin composition.

The upper limit of the volume-based cumulative 50% particle size ($D_{50}$) of the filler is, for example, preferably equal to or smaller than 50 μm, more preferably equal to or smaller than 30 μm, and even more preferably equal to or smaller than 25 μm. In a case where the upper limit of $D_{50}$ of the filler is within the above range, it is possible to inhibit coarse fillers from hindering the contact between the resin composition and the flux. As a result, the compatibility between the resin composition and the flux can be improved.

In the present embodiment, the volume-based cumulative 50% particle size ($D_{50}$) of the filler can be calculated, for example, by measuring a volume-based particle size distribution of particles by using a commercially available laser diffraction-type particle size analyzer (for example, SALD-7000 manufactured by Shimadzu Corporation).

The lower limit of the content of the filler in the resin composition according to the present embodiment with respect to the solid content (100 parts by mass) of the resin composition is, for example, preferably equal to or greater than 70 parts by mass, more preferably equal to or greater than 75 parts by mass, and even more preferably equal to or greater than 80 parts by mass. In a case where the lower limit of the content of the filler is within the above range, the hardness of the cured product of the resin composition can be improved, and the adhesiveness between the cured product of the resin composition and the base material can be improved.

The upper limit of the content of the filler in the resin composition with respect to the solid content of the resin composition is, for example, preferably equal to or smaller than 95 parts by mass, more preferably equal to or smaller than 93 parts by mass, and even more preferably equal to or smaller than 90 parts by mass. In a case where the upper limit of the content of the filler is within the above range, the viscosity of the resin composition can be improved. As a result, in introducing the resin composition, the flux is more suitably incorporated into the resin composition.

(Coupling Agent)

The coupling agent is not limited, and known coupling agents used in electronic devices can be used.

Specifically, examples of the coupling agent include vinylsilane such as vinyltrimethoxysilane or vinyltriethoxysilane; epoxysilane such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, or 3-glycidoxypropyltriethoxysilane; styrylsilane such as p-styryltrimethoxysilane; methacrylsilane such as 3-methacryloxypropylmethyldimethoxysilane, 3-methacryloxypropyltrimethoxysilane, 3-methacryloxypropylmethyldiethoxysilane, or 3-methacryloxypropyltriethoxysilane; acrylsilane such as 3-acryloxypropyltrimethoxysilane; aminosilane such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl γ-aminopropyltrimethoxysilane, or phenylaminopropyltrimethoxysilane; isocyanurate silane; alkylsilane; ureidosilane such as 3-ureidopropyltrialkoxysilane; mercaptosilane such as 3-mercaptopropylmethyldimethoxysilane or 3-mercaptopropyltrimethoxysilane; Isocyanate silane such as 3-isocyanatepropyltriethoxysilane; a titanium-based compound; aluminum chelates; an aluminum/zirconium-based compound; and the like. As the coupling agent, among the above specific examples, one kind of coupling agent or two or more kinds of coupling agents can be mixed with the resin composition. As the coupling agent, for example, it is preferable to use the aminosilane among the above specific examples. Furthermore, as the aminosilane, for example, it is more preferable to use N-phenyl γ-aminopropyltrimethoxysilane. In a case where the above coupling agent is used, the dispersibility of the flux residues in the resin composition can be further improved. As a result, the occurrence of flux residues can be inhibited to a higher extent.

(Release Agent)

The release agent is not limited, and known release agents used in sealing materials for electronic devices can be used.

Specifically, examples of the release agent include natural wax such as carnauba wax, synthetic wax such as diethanolamine dimontan ester, a higher fatty acid such as zinc stearate and a metal salt thereof, paraffin, and the like. As the release agent, among the above specific examples, one kind of release agent or two or more kinds of release agents can be mixed with the resin composition.

(Colorant)

The colorant is not limited, and known colorants used in sealing materials for electronic devices can be used.

Specifically, examples of the colorant include carbon black, red iron oxide, titanium oxide, and the like. As the colorant, among the above specific examples, one kind of colorant or two or more kinds of colorants can be mixed with the resin composition.

(Flame Retardant)

The flame retardant is not limited, and known flame retardants used in sealing materials for electronic devices can be used.

Specifically, examples of the flame retardant include aluminum hydroxide, magnesium hydroxide, zinc borate, zinc molybdate, phosphazene, and the like. As the flame retardant, among the above specific examples, one kind of flame retardant or two or more kinds of flame retardants can be mixed with the resin composition.

(Ion Scavenger)

The ion scavenger is not limited, and known ion scavengers used in sealing materials for electronic devices can be used.

Specifically, examples of the ion scavenger include hydrotalcite, zeolite, bismuth hydroxide, and the like.

(Stress Reducer)

The stress reducer is not limited, and known stress reducers used in sealing materials for electronic devices can be used.

Specifically, examples of the stress reducer include a silicone compound such as silicone oil or silicone rubber; a polybutadiene compound; an acrylonitrile-butadiene copolymer, and the like. As the stress reducer, among the above specific examples, one kind of stress reducer or two or more kinds of stress reducers can be mixed with the resin composition.

(Method for Manufacturing Resin Composition)

Next, the method for manufacturing a resin composition according to the present embodiment will be described.

The method for manufacturing a resin composition according to the present embodiment includes, for example, a mixing step of mixing together the aforementioned raw material components so as to prepare a mixture, and a molding step of then molding the mixture.

(Mixing Step)

The mixing step is a step of mixing together the raw material components so as to prepare a mixture. The mixing method is not limited, and known methods can be used according to the components used.

In the mixing step, specifically, the raw material components contained in the resin composition described above are uniformly mixed together by using a mixer or the like. Then, the mixture is melt-kneaded with a kneader such as a roll, a kneader, or an extruder, thereby preparing a mixture.

(Molding Step)

After the mixing step described above, a molding step (S2) of molding the mixture is performed.

The molding method is not limited, and known methods can be used according to the shape of the resin composition. The shape of the resin composition is not limited. For example, the resin composition is in the shape of granules, powder, tablets, a sheet, or the like. The shape of the resin composition can be selected according to the molding method.

Examples of the molding step for preparing a granular resin composition include a step of pulverizing the cooled mixture after the melt-kneading. For example, the granular resin composition may be sieved such that the granule size is adjusted. Furthermore, for example, the granular resin composition may be treated by a method such as a centrifugal milling method or a hot cutting method such that the dispersity or fluidity thereof is adjusted.

Examples of the molding step for preparing a powdery resin composition include a step of pulverizing the mixture so as to obtain a granular resin composition and then further pulverizing the granular resin composition.

In addition, examples of the molding step for preparing a tablet-shaped resin composition include a step of pulverizing the mixture so as to obtain a granular resin composition and then molding the granular resin composition into tablets.

Furthermore, examples of the molding step for preparing a sheet-shaped resin composition include a step of subjecting the mixture to extrusion molding or calender molding after the melt-kneading.

(Flux)

The flux according to the present embodiment contains a rosin, an activator, and a solvent.

It is preferable that the flux according to the present embodiment is, for example, a low-residue type flux which generates a small absolute amount of flux residues by reflow soldering. In a case where such flux is used, the absolute amount of the flux residues can be reduced, and hence the flux residues can be dispersed better in the resin composition. In a case where the low-residue type flux is heated to 250° C. from 25° C. at a heating rate of 10° C./min in a nitrogen atmosphere, the percentage of the mass of the flux (percent change in mass) after heating to the mass of the flux before heating that is evaluated by thermogravimetry is equal to or lower than 21% by mass. For example, the percent change in mass is preferably equal to or lower than 15% by mass, more preferably equal to or lower than 10% by mass, and even more preferably equal to or lower than 5% by mass. In a case where this type of flux is used, the absolute amount of flux residues can be reduced. As a result, the flux residues can be dispersed better in the resin composition, and the compatibility can be improved.

The lower limit of the percent change in mass may be, for example, higher than 0% by mass, equal to or higher than 5% by mass, or equal to or higher than 10% by mass.

Hereinafter, the components contained in the flux will be specifically described.

(Rosin)

Specific examples of the rosin (pine resin) include raw rosin such as gum rosin, wood rosin, and tall oil rosin; a rosin derivative derived from the above raw rosin; and the like.

Specifically, examples of the rosin derivative include $\alpha,\beta$ unsaturated carboxylic acid-modified rosin such as acrylic acid-modified rosin, phenol-modified rosin, maleic acid-modified rosin, and fumaric acid-modified rosin; hydrogenated rosin; polymerized rosin; disproportionated rosin: purified rosin obtained by purifying the $\alpha,\beta$ unsaturated carboxylic acid-modified rosin, hydrogenated rosin, polymerized rosin, and disproportionated rosin described above; and the like. As the rosin, among the above specific examples, one kind of rosin can be used singly, or two or more kinds of rosin can be used in combination. As the rosin, for example, it is preferable to use the α,β unsaturated carboxylic acid-modified rosin among the above specific examples.

The upper limit of the content of the rosin in the flux according to the present embodiment with respect to 100 parts by mass of the flux is equal to or smaller than 18 parts by mass. The upper limit of the content of the resin is, for example, preferably equal to or smaller than 15 parts by mass, and more preferably equal to or smaller than 10 parts by mass. In a case where the upper limit of the content of the rosin is within the above range, the flux residues can be reduced. As a result, the compatibility can be improved.

The lower limit of the content of the rosin in the flux according to the present embodiment with respect to 100 parts by mass of the flux is equal to or greater than 1 part by mass. The lower limit of the content of the resin is, for example, preferably equal to or greater than 2 parts by mass, and more preferably equal to or greater than 3 parts by mass. In a case where the lower limit of the content of the rosin is within the above range, soldering can be suitably performed.

(Activator)

As the activator, specifically, an amine, an organic acid, or the like can be used. As the activator, among the above specific examples, one kind of activator can be used singly, or two or more kinds of activators can be used in combination.

Hereinafter, details of the activator will be specifically described.

(Amine)

Specifically, examples of the amine used as the activator include an aliphatic amine such as cyclohexylamine; an aromatic amine such as aniline; a heterocyclic amine such as imidazoles, benzotriazoles, or pyridines; hydrochloride, hydrobromide, and tetrafluoroborate of the aliphatic amine, aromatic amine, and heterocyclic amine described above; and the like. As the amine, among the above specific examples, one kind of amine can be used singly, or two or more kinds of amines can be used in combination. As the amine, for example, it is preferable to use imidazole or benzotriazole among the above specific examples.

Specifically, examples of the imidazole include 2-methylimidazole, 2-undecylimidazole, 2-heptadecylimidazole, 1,2-dimethylimidazole, 2-ethyl-4-methylimidazole, 2-phenylimidazole and 2-methylimidazole, phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-Ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-Methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, a 2,4-diamino-6-vinyl-s-triazine isocyanuric acid adduct, 2,4-diamino-6-methacryloyloxyethyl-s-triazine, an epoxy-imidazole adduct, 2-methylbenzimidazole, 2-octylbenzimidazole, 2-pentylbenzimidazole, 2-(1-ethylpentyl) benzimidazole, 2-nonylbenzimidazole, 2-(4-thiazolyl) benzimidazole, benzimidazole, and the like.

Specifically, examples of the benzotriazole include 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl)aminomethyl]benzotriazole, carboxybenzotriazole, 1-[N,N-bis(2-ethylhexyl)aminomethyl] methylbenzotriazole, 2,2'-[[(methyl-1H-benzotriazol-1-yl)methyl]imino]bisethanol, an aqueous solution of 1,2,3-benzotriazole sodium salt, 1-(1',2'-dicarboxyethyl) benzotriazole, 1-(2,3-dicarboxypropyl)benzotriazole, 1-[(2-ethylhexylamino)methyl]benzotriazole, 2,6-bis[(1H-benzotriazol-1-yl)methyl]-4-methylphenol, 5-methylbenzotriazole, and the like.

Specifically, as the organic acid used as the activator, it is possible to use adipic acid, azelaic acid, eicosane diacid, citric acid, glycolic acid, succinic acid, salicylic acid, diglycolic acid, dipicolinic acid, dibutylaniline diglycolic acid, suberic acid, sebacic acid, thioglycolic acid, terephthalic acid, dodecanedioic acid, parahydroxyphenylacetic acid, picolinic acid, phenylsuccinic acid, phthalic acid, fumaric acid, maleic acid, malonic acid, lauric acid, benzoic acid, p-tert-butylbenzoic acid, tartaric acid, tris(2-carboxyethyl) isocyanurate, glycine, 1,3-cyclohexanedicarboxylic acid, 2,2-bis(hydroxymethyl)propionic acid, 2,2-bis(hydroxymethyl)butanoic acid, 2,3-dihydroxybenzoic acid, 2,4-diethylglutaric acid, 2-quinolinecarboxylic acid, 3-hydroxybenzoic acid, malic acid, p-anisic acid, stearic acid, 12-hydroxystearic acid, oleic acid, linoleic acid, linolenic acid, dimer acid, hydrogenated dimer acid, trimer acid, hydrogenated trimer acid, and the like. As the organic acid, among the above specific examples, one kind of organic acid can be used singly, or two or more kinds of organic acids can be used in combination.

Specifically, examples of the solvent used in the flux include water, an alcohol-based solvent, a glycol ether-based solvent, terpineols, and the like. Examples of the alcohol-based solvent include isopropyl alcohol, 1,2-butanediol, isobornylcyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexanedimethanol, erythritol, threitol, guaiacol glycerol ether, 3,6-dimethyl-4-octyne-3,6-diol, 2,4,7,9-tetramethyl-5-decyne-4,7-diol, and the like. Examples of the glycol ether-based solvent include diethylene glycol mono-2-ethylhexyl ether, ethylene glycol monophenyl ether, 2-methylpentane-2,4-diol, diethylene glycol monohexyl ether, diethylene glycol dibutyl ether, triethylene glycol monobutyl ether, and the like.

(Electronic Device)

Next, the electronic device according to the present embodiment will be described.

Figure 2:
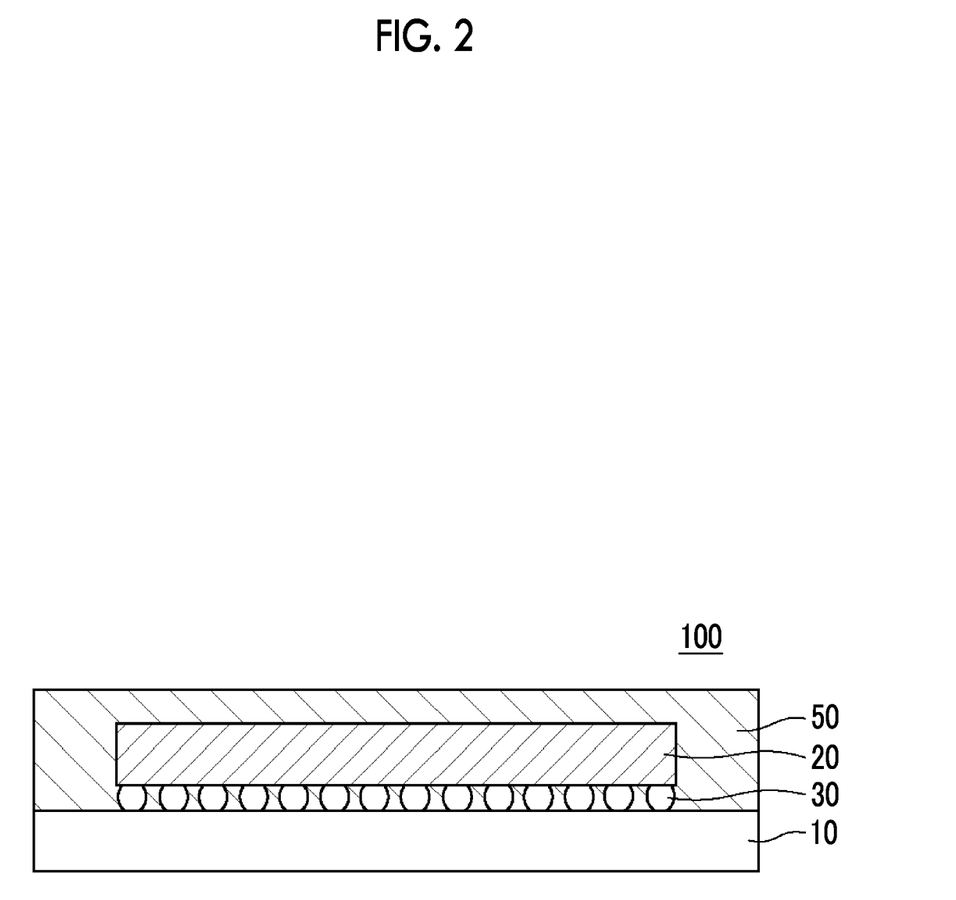
FIG. 2 is a view showing an example of an electronic device according to the present embodiment.

FIG. 2 is a view showing an example of the electronic device according to the present embodiment.

As shown in FIG. 2, an electronic device 100 according to the present embodiment includes, for example, a base material 10, an electronic component 20, and a sealing material 50 that seals the electronic component 20. The sealing material 50 is made, for example, of a cured product of the resin composition described above.

In the electronic device 100 shown in FIG. 2, the electronic component 20 and the base material 10 are electrically connected through solder bumps 30. However, the electrical connection method is not limited thereto.

The base material 10 according to the present embodiment is not limited as long as the base material 10 has an exposed metal portion on a surface of the base material 10. Specifically, examples of the exposed metal portion include an electric circuit such as a copper circuit; metal plating of silver or gold; and the like.

The base material 10 may be, for example, an organic substrate composed of an epoxy resin, a cyanate resin, a maleimide resin, or the like, or a ceramic substrate.

The electronic component 20 according to the present embodiment is not limited as long as the electronic component 20 has the solder bumps 30. For example, the electronic component 20 is preferably a semiconductor element.

The semiconductor element is not limited, and examples thereof include an integrated circuit, a large-scale integrated circuit, a transistor, a thyristor, a diode, and a solid-state image element.

The electronic device according to the present embodiment is not limited, but is preferably a semiconductor device obtained by molding a semiconductor element.

Specifically, examples of types of the semiconductor device include Mold Array Package (MAP), Quad Flat Package (QFP), Small Outline Package (SOP), Chip Size Package (CSP), Quad Flat Non-leaded Package (QFN), Small Outline Non-leaded Package (SON), Ball Grid Array (BGA), Lead Flame BGA (LF-BGA), Flip Chip BGA (FCBGA), Molded Array Process BGA (MAPBGA), Embedded Wafer-Level BGA (eWLB), Fan-In type eWLB, Fan-Out type eWLB, and the like.

(Method for Manufacturing Electronic Device)

The method for manufacturing an electronic device according to the present embodiment includes, for example, a flux treatment step of treating an exposed metal portion with a flux by bringing the exposed metal portion of a base material with the flux, a reflow soldering step of causing an electronic component and the base material to reflow such that the electronic component and the exposed metal portion of the base material are electrically connected through solder bumps, and an introduction step of introducing a resin composition such that the resin composition comes into contact with a surface of the exposed metal portion treated with the flux.

In the method for manufacturing an electronic device according to the present embodiment, a step of cleaning the flux is not performed.

Hereinafter, each step will be specifically described using FIGS. 3A to 3E.

(Flux Treatment Step)

In the flux treatment step, the exposed metal portion of the base material is treated with a flux by being brought into contact with the flux.

Figure 3A:
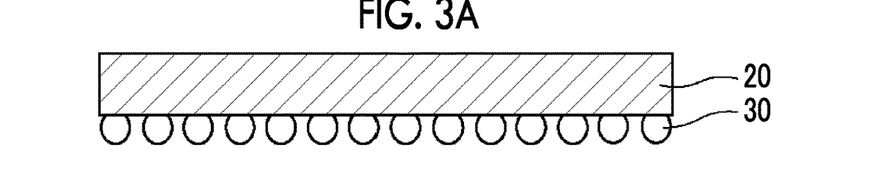
FIGS. 3A to 3E are views for illustrating a method for manufacturing an electronic device according to the present embodiment.

In the flux treatment step, first, as shown in FIG. 3A, the electronic component 20 having the solder bumps 30 is prepared.

Figure 3B:
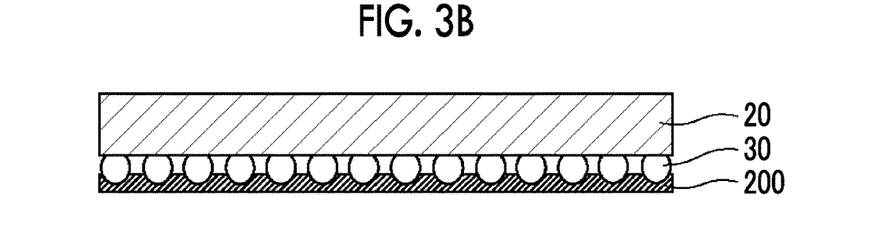

Then, as shown in FIG. 3B, the solder bumps 30 provided on the electronic component 20 are coated with the flux 200. Specifically, a surface of the prepared electronic component 20 on which the solder bumps 30 are not provided is brought into contact with a table coated with a flux 200, such that the flux 200 is attached to the solder bumps 30 provided on the electronic component 20.

Figure 3C:
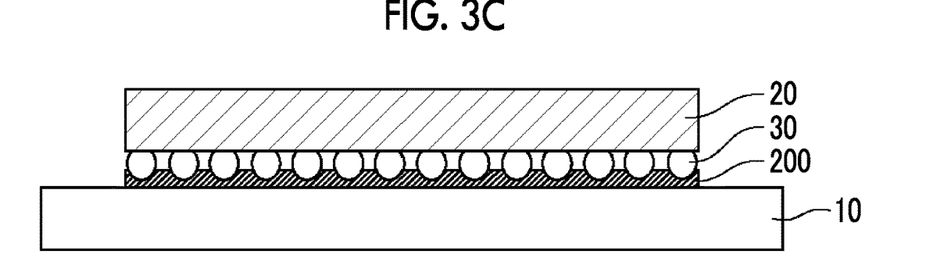

Thereafter, as shown in FIG. 3C, the electronic component 20 is disposed directly on the base material 10. In this way, a flux treatment is performed in which the exposed metal portion of the base material 10 is brought into contact with the flux 200 such that the flux 200 is attached to the exposed metal portion.

(Reflow Soldering Step)

In the reflow soldering step, the electronic component and the base material are caused to reflow such that the electronic component and the exposed metal portion of the base material are electrically connected through the solder bumps.

Figure 3D:
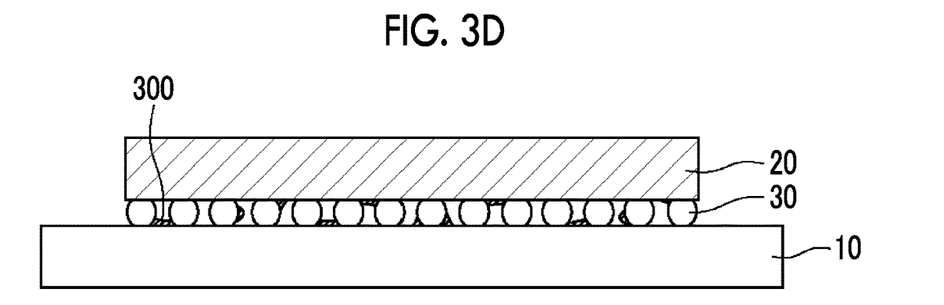

Specifically, the structure composed of the electronic component and the base material as shown in FIG. 3C is caused to reflow such that the electronic component and the exposed metal portion of the base material are electrically connected through the solder bumps. In this way, the structure shown in FIG. 3D is obtained. In the structure shown in FIG. 3D, for example, flux residues 300 are attached to the exposed metal portion of the base material 10, the electronic component 20 mounted on the base material 10, and the solder bumps 30 included in the electronic component 20.

(Introduction Step)

In the introduction step, the resin composition is introduced such that the resin composition comes into contact with a surface of the exposed metal portion treated with the flux.

Figure 3E:
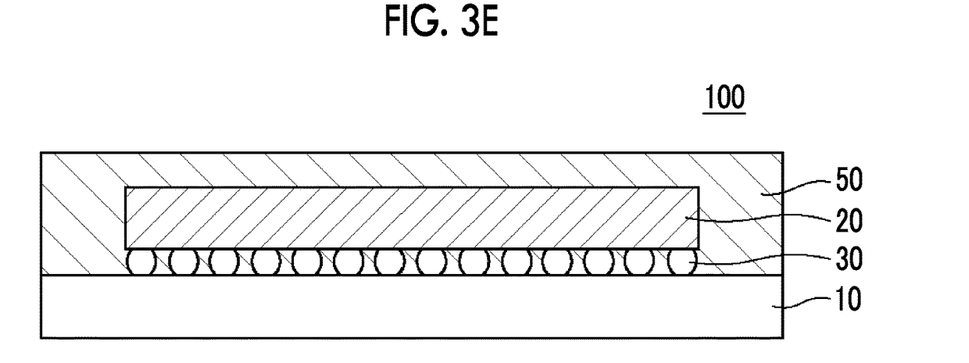

Specifically, as shown in FIG. 3E, the sealing material 50 is formed by introducing and curing the resin composition.

The method of introducing the resin composition is not limited, and specifically, a transfer molding method, a compression molding method, an injection molding method, or the like can be used.

Hitherto, the embodiments of the present invention have been described. However, these are merely examples of the present invention, and various other constitutions can be adopted. It should be noted that the present invention is not limited to the embodiments described above, and includes modifications, ameliorations, and the like as long as the object of the present invention can be achieved.

EXAMPLE

Hereinafter, the present invention will be specifically described using examples, but the present invention is not limited to the description of the examples.

<Resin Composition>

Details of the raw material components of the resin compositions used in examples and comparative examples are as follows.

(Epoxy Resin)

Epoxy resin 1: mixture of triphenylmethane-type epoxy resin and biphenyl-type epoxy resin (EPIKOTE YL6677 manufactured by Mitsubishi Chemical Corporation)

Epoxy resin 2: biphenylene skeleton-containing phenol aralkyl-type epoxy resin (NC-3000 manufactured by Nippon Kayaku Co., Ltd.)

Epoxy resin 3: biphenylene skeleton-containing phenol aralkyl-type epoxy resin (NC-3000-L manufactured by Nippon Kayaku Co., Ltd.)

Epoxy resin 4: triphenylmethane-type epoxy resin (1032H60 manufactured by Mitsubishi Chemical Corporation)

Epoxy resin 5: bisphenol A-type epoxy resin (YL6810 manufactured by Mitsubishi Chemical Corporation)

Epoxy resin 6: biphenyl-type epoxy resin (YX4000K manufactured by Mitsubishi Chemical Corporation)

Epoxy resin 7: mixture of biphenylene skeleton-containing phenol aralkyl-type epoxy resin and biphenol glycidyl ether (CER-3000-L manufactured by Nippon Kayaku Co., Ltd.)

(Phenolic Resin Curing Agent)

Phenolic resin curing agent 1: triphenylmethane-type phenolic resin (MEH-7500 manufactured by MEIWA PLASTIC INDUSTRIES, LTD.)

Phenolic resin curing agent 2: biphenylene skeleton-containing phenol aralkyl resin (MEH-7851SS manufactured by MEIWA PLASTIC INDUSTRIES, LTD.)

Phenolic resin curing agent 3: biphenylene skeleton-containing phenol aralkyl resin (MEH-7851M manufactured by MEIWA PLASTIC INDUSTRIES, LTD.)

Phenolic resin curing agent 4: biphenylene skeleton-containing phenol aralkyl resin (MEH-7851H manufactured by MEIWA PLASTIC INDUSTRIES, LTD.)

Phenolic resin curing agent 5: biphenylene skeleton-containing phenol aralkyl resin (GPH-65 manufactured by Nippon Kayaku Co., Ltd.)

Phenolic resin curing agent 6: trihydroxyphenylmethane-type phenolic resin modified with formaldehyde (SK Resin HE910-20 manufactured by AIR WATER INC)

Phenolic resin curing agent 7: novolac-type phenolic resin (Sumilite Resin PR-51470 manufactured by Sumitomo Bakelite Co., Ltd.)

For each of the epoxy resins 1 to 7 and phenolic resin curing agents 1 to 7 described above, solubility parameters (SP) were calculated based on the Hansen's method. Table 1 shows the calculated SP values.

The Hansen's method is a method of dividing the energy of evaporation into a dispersion energy dD, a polar energy dP, and a hydrogen bonding energy dH, and calculating vector lengths of dD, dP, and dH as SP values by treating dD, dP, and dH as three-dimensional vectors.

The number average molecular weight of each of the epoxy resins 1 to 7 and phenolic resin curing agents 1 to 7 described above was measured using columns consisting of Shodex GPC KF-603 and KF-602.5 manufactured by SHOWA DENKO K.K. under the following measurement conditions.

Measurement conditions: column temperature 40° C.
Solvent: tetrahydrofuran
Flow rate: 0.6 ml/min
Detection: RI (differential refractometer)

The measured number average molecular weight is shown in the following Table 1.

TABLE 1

| | | SP value $[cal/cm^3]^{0.5}$ | Number average molecular weight [—] |
|---|---|---|---|
| Epoxy resin | Epoxy resin 1 | 22.1 | 248 |
| | Epoxy resin 2 | 22.0 | 500 |
| | Epoxy resin 3 | 22.0 | 462 |
| | Epoxy resin 4 | 21.9 | 419 |
| | Epoxy resin 5 | 20.9 | 225 |
| | Epoxy resin 6 | 20.1 | 202 |
| | Epoxy resin 7 | 22.2 | 450 |
| Phenolic resin curing agent | Phenolic resin curing agent 1 | 23.7 | 299 |
| | Phenolic resin curing agent 2 | 21.6 | 441 |
| | Phenolic resin curing agent 3 | 21.6 | 582 |
| | Phenolic resin curing agent 4 | 21.6 | 643 |

TABLE 1-continued

| | SP value $[cal/cm^3]^{0.5}$ | Number average molecular weight [—] |
|---|---|---|
| Phenolic resin curing agent 5 | 21.6 | 454 |
| Phenolic resin curing agent 6 | 23.5 | 310 |
| Phenolic resin curing agent 7 | 24.0 | 617 |

(Other components)

Curing accelerator 1: triphenylphosphine (TPP manufactured by HOKKO CHEMICAL INDUSTRY CO., LTD.)
Filler 1: fused spherical silica (FB-950FC, manufactured by Denka Company Limited., $D_{50}$: 24 μm, content of coarse particles having particle size greater than 75 μm: equal to or smaller than 0.5% by weight)
Colorant 1: carbon black (MA-600 manufactured by Mitsubishi Chemical Corporation)
Coupling agent 1: N-phenyl γ-aminopropyltrimethoxysilane (KBM-573 manufactured by Shin-Etsu Chemical Co., Ltd)
Release agent 1: carnauba wax (Nikko Carnauba manufactured by NIKKO FINES INDUSTRIES Co., Ltd.)

(Preparation of Resin Composition)

The raw material components were mixed together at the mixing ratio described in the following Table 2 by using a mixer at room temperature, and then biaxially kneaded at a temperature equal to or higher than 70° C. and equal to or lower than 100° C. Thereafter, the mixture was cooled to room temperature and then pulverized, thereby preparing resin compositions 1 to 14.

The average solubility parameter SP1 of a resin group consisting of the epoxy resin and the phenolic resin curing agent in each of the obtained resin compositions 1 to 14 and the number average molecular weight Mn1 of the resin group are shown in the following Table 2.

The average solubility parameter SP1 was calculated by the following Equation 1.

Average solubility parameter $SP1=\Sigma(A_{(n)} \times Ca_{(n)}) + \Sigma(B_{(m)} \times Cb_{(m)})$ (Equation 1)

(In the Equation 1, $A_{(n)}$ represents a solubility parameter calculated based on the Hansen's method for each of n kinds of epoxy resins contained in a resin composition. $Ca_{(n)}$ represents a content of each of n kinds of epoxy resins with respect to the total content of all epoxy resins and all phenolic resin curing agents in the resin composition. $B_{(m)}$ represents a solubility parameter calculated based on the Hansen's method for each of m kinds of phenolic resin curing agents contained in the resin composition. $Cb_{(m)}$ represents a content of each of m kinds of phenolic resin curing agents with respect to the total content of all epoxy resins and all phenolic resin curing agents in the resin composition.)

The number average molecular weight Mn1 was calculated by the following Equation 3.

Number average molecular weight $Mn1=\Sigma(a_{(n)} \times Ca_{(n)}) + \Sigma(b_{(m)} \times Cb_{(m)})$ (Equation 3)

(In the above Equation 3, $a_{(n)}$ represents a value of number average molecular weight of each of n kinds of epoxy resins contained in a resin composition. $Ca_{(n)}$ represents a content of each of n kinds of epoxy resins with respect to the total content of all epoxy resins and all phenolic resin curing agents in the resin composition. $b_{(m)}$ represents a value of number average molecular weight of each of m kinds of phenolic resin curing agents contained in the resin composition. $Cb_{(m)}$ represents a content of each of m kinds of phenolic resin curing agents with respect to the total content of all epoxy resins and all phenolic resin curing agents in the resin composition.)

TABLE 2

| | | | Resin composition 1 | Resin composition 2 | Resin composition 3 | Resin composition 4 | Resin composition 5 | Resin composition 6 | Resin composition 7 | Resin composition 8 | Resin composition 9 | Resin composition 10 | Resin composition 11 | Resin composition 12 | Resin composition 13 | Resin composition 14 |
|---|---|---|---|---|---|---|---|---|---|---|---|---|---|---|---|---|
| Resin composition [part by mass] | Epoxy resin | Epoxy resin 1 | | 8.5 | 4.8 | | | 3.6 | | | | | | | | |
| | | Epoxy resin 2 | | | | 4.7 | 3.6 | | 3.2 | | | 4.0 | | 10.0 | 5.0 | 8.0 |
| | | Epoxy resin 3 | | | 5.5 | | | | | | | | | | | |
| | | Epoxy resin 4 | | | | | 7.0 | | | | | | | | | |
| | | Epoxy resin 5 | | | 2.1 | | | | 3.2 | | | | | | | |
| | | Epoxy resin 6 | 10.0 | | | 3.7 | | | | 8.0 | | 4.0 | 14.0 | | 6.0 | |
| | | Epoxy resin 7 | | | | | | | | | 9.0 | | | | | |
| | Phenolic resin curing agent | Phenolic resin curing agent 1 | | 4.2 | | | 4.1 | | | | | | | | | |
| | | Phenolic resin curing agent 2 | | 0.1 | 1.9 | | | | | | 4.0 | | 4.0 | 3.0 | 4.0 | |
| | | Phenolic resin curing agent 3 | | | | | | | | | | | | 3.0 | | |
| | | Phenolic resin curing agent 4 | 3.0 | | | | | | | 4.5 | | 4.0 | | | | 6.0 |
| | | Phenolic resin curing agent 5 | | | | 4.8 | 2.7 | 1.9 | 4.6 | | | | | | | |
| | | Phenolic resin curing agent 6 | 3.0 | 0.7 | 1.9 | | | 1.9 | | | | | | | | |
| | | Phenolic resin curing agent 7 | | | | | | | | 0.5 | | | 2.0 | | | |
| | Curing accelerator | Curing accelerator 1 | 0.5 | 0.4 | 0.3 | 0.4 | 0.5 | 0.4 | 0.4 | 0.4 | 0.4 | 0.4 | 0.5 | 0.4 | 0.4 | 0.4 |
| | Filler | Filler 1 | 82.9 | 85.5 | 88.4 | 85.0 | 80.4 | 88.0 | 88.0 | 85.0 | 87.0 | 87.0 | 78.9 | 83.0 | 84.0 | 85.0 |
| | Colorant | Colorant 1 | 0.2 | 0.2 | 0.2 | 0.2 | 0.2 | 0.2 | 0.2 | 0.2 | 0.2 | 0.2 | 0.2 | 0.2 | 0.2 | 0.2 |
| | Coupling agent | Coupling agent 1 | 0.2 | 0.2 | 0.2 | 0.2 | 0.2 | 0.2 | 0.2 | 0.2 | 0.2 | 0.2 | 0.2 | 0.2 | 0.2 | 0.2 |
| | Release agent | Release agent 1 | 0.2 | 0.2 | 0.2 | 0.2 | 0.2 | 0.2 | 0.2 | 0.2 | 0.2 | 0.2 | 0.2 | 0.2 | 0.2 | 0.2 |
| | | Total | 100.0 | 100.0 | 100.0 | 100.0 | 100.0 | 100.0 | 100.0 | 100.0 | 100.0 | 100.0 | 100.0 | 100.0 | 100.0 | 100.0 |
| Resin group | | Average solubility parameter SP1 $[cal/cm^3]^{0.5}$ | 21.0 | 22.7 | 22.0 | 21.4 | 22.3 | 22.2 | 21.5 | 22.1 | 20.6 | 21.2 | 20.8 | 21.9 | 21.1 | 21.8 |
| | | Number average molecular weight Mn1 [—] | 304.9 | 268.4 | 288.1 | 390.7 | 418.1 | 376.7 | 401.1 | 518.0 | 281.7 | 448.3 | 291.3 | 504.3 | 365.1 | 561.3 |

<Flux>
Details of the raw material components of the flux used in each of the examples and comparative examples are as follows.
Rosin 1: hydrogenated rosin modified with acrylic acid
Organic acid 1: glutaric acid
Amine 1: 2-undecyl imidazole
Solvent: mixed solvent of isobornyl cyclohexanol (87.5 wt %) and 1,3-butylene glycol (12.5 wt %)

(Preparation of Flux)

The raw material components were mixed together at the mixing ratio described in the following Table 3, thereby preparing fluxes 1 to 5.

(Percent Change in Mass of Flux)

The percent change in mass of the obtained fluxes 1 to 5 before and after a heating treatment was measured based on the following procedure.

First, each of the fluxes 1 to 5 was subjected to a heating treatment in a nitrogen atmosphere under the heating condition in which each flux was heated to 250° C. from 25° C. at a heating rate of 10° C./min. At this time, by using a thermogravimetric analyzer, a mass M1 of each flux before the heating treatment and a mass M2 of each flux after the heating treatment were measured. By using the obtained M1 and M2, a percent change in mass (% by mass) of each flux before and after the heating treatment was calculated based on Equation:(M2/M1)×100.

The percent change in mass of each flux before and after the heating treatment is represented by the percentage of the mass of each flux after heating to the mass of each flux before heating. The measurement results are shown in the following Table 3.

TABLE 3

|  |  |  | Flux 1 | Flux 2 | Flux 3 | Flux 4 | Flux 5 |
|---|---|---|---|---|---|---|---|
| Flux [part by mass] | Rosin | Rosin 1 | 3 | 10 | 15 | 20 | 0 |
|  | Activator | Organic acid 1 | 3 | 3 | 3 | 3 | 3 |
|  |  | Amine 1 | 4 | 4 | 4 | 4 | 4 |
|  | Solvent |  | 90 | 83 | 78 | 73 | 93 |
|  | Total |  | 100 | 100 | 100 | 100 | 100 |
| Evaluation result | Percent change in mass [% by mass] |  | 8 | 13 | 17 | 22 | 4 |

(Preparation of Electronic Device)

By using the obtained resin composition and flux, an electronic device was prepared according to the following procedure.

First, a 15 mm (length)×15 mm (width) printed circuit board was prepared which included a copper circuit on one surface thereof.

Then, a flux was applied to one surface of the printed circuit board.

Thereafter, a 10 mm (length)×10 mm (width)×250 μm (thickness) flip chip-type package having solder bumps was prepared.

Subsequently, the flip chip-type package was disposed on one surface of the printed circuit board such that the surface of the package with the solder bumps faced the aforementioned surface of the printed circuit board. In a nitrogen atmosphere, this assembly was subjected to a reflow treatment at a peak temperature of 240° C. that was kept for 10 seconds such that the solder bumps were melted. In this way, the flip chip-type package and the copper circuit of the printed circuit board were soldered. The reflow treatment was performed twice.

Then, the printed circuit board on which the flip chip-type package was mounted was placed in a mold, and by using a transfer molding machine, a resin composition was injected into the mold under the conditions of a mold temperature of 175° C. and an injection pressure of 9.8 MPa, thereby performing molding. At this time, the resin composition was introduced such that the resin composition came into contact with the surface of the copper circuit and the surface of the solder bumps and covered the periphery of the flip chip-type package. During molding, a heating treatment was performed at 175° C. for 120 seconds such that the resin composition was cured, thereby forming a sealing material.

In this way, an electronic device was prepared.

In preparing the above electronic device, each of the resin compositions 1 to 14 and each of the fluxes 1 to 5 were used as a resin composition and a flux respectively by being combined as described in Table 4.

The conditions of Examples 1 to 24 and Comparative Examples 1 to 46 were set according to the combinations of the resin compositions 1 to 14 and the fluxes 1 to 5 in Table 4. In each of Examples 1 to 24 and Comparative Examples 1 to 46, an electronic device was prepared in the same manner as the above procedure.

TABLE 4

|  |  | Flux | | | | |
|---|---|---|---|---|---|---|
|  |  | Flux 1 | Flux 2 | Flux 3 | Flux 4 | Flux 5 |
| Resin composition | Resin composition 1 | Example 1 | Example 9 | Example 17 | Comparative Example 19 | Comparative Example 33 |
|  | Resin composition 2 | Example 2 | Example 10 | Example 18 | Comparative Example 20 | Comparative Example34 |
|  | Resin composition 3 | Example 3 | Example 11 | Example 19 | Comparative Example 21 | Comparative Example 35 |
|  | Resin composition 4 | Example 4 | Example 12 | Example 20 | Comparative Example 22 | Comparative Example 36 |
|  | Resin composition 5 | Example 5 | Example 13 | Example 21 | Comparative Example 23 | Comparative Example 37 |
|  | Resin composition 6 | Example 6 | Example 14 | Example 22 | Comparative Example 24 | Comparative Example 38 |
|  | Resin composition 7 | Example 7 | Example 15 | Example 23 | Comparative Example 25 | Comparative Example 39 |
|  | Resin composition 8 | Example 8 | Example 16 | Example 24 | Comparative Example 26 | Comparative Example 40 |
|  | Resin composition 9 | Comparative Example 1 | Comparative Example 7 | Comparative Example 13 | Comparative Example 27 | Comparative Example 41 |
|  | Resin composition 10 | Comparative Example 2 | Comparative Example 8 | Comparative Example 14 | Comparative Example 28 | Comparative Example 42 |
|  | Resin composition 11 | Comparative Example 3 | Comparative Example 9 | Comparative Example 15 | Comparative Example 29 | Comparative Example 43 |

TABLE 4-continued

| | | | Flux | | |
|---|---|---|---|---|---|
| | Flux 1 | Flux 2 | Flux 3 | Flux 4 | Flux 5 |
| Resin composition 12 | Comparative Example 4 | Comparative Example 10 | Comparative Example 16 | Comparative Example 30 | Comparative Example 44 |
| Resin composition 13 | Comparative Example 5 | Comparative Example 11 | Comparative Example 17 | Comparative Example 31 | Comparative Example 45 |
| Resin composition 14 | Comparative Example 6 | Comparative Example 12 | Comparative Example 18 | Comparative Example 32 | Comparative Example 46 |

(Compatibility Test)

For the obtained electronic devices of Examples 1 to 24 and Comparative Examples 1 to 46, the compatibility between the flux and the resin composition that was exhibited in a case where the flux residues were not cleaned was evaluated as follows.

First, the cured product (sealing material) of the resin composition including the flip chip-type package was peeled from one surface of the printed circuit board of each electronic device.

Then, the surface of the cured product that was in close contact with one surface of the printed circuit board and the portion of one surface of the printed circuit board that was in close contact with the cured product were visually observed and evaluated based on the following evaluation standard.

O: As a result of visual observation, it has been confirmed that no flux residue is present on the surface of the cured product of the resin composition and the surface of the printed circuit board, and flux residues are incorporated into the resin composition.

X: As a result of visual observation, it has been confirmed that flux residues are present on the surface of the cured product of the resin composition and the surface of the printed circuit board, and the flux residues remain without being incorporated into the resin composition.

As a result of the compatibility test, all of Examples 1 to 24 were evaluated as O, and all of Comparative Examples 1 to 46 were evaluated as X.

From this result, it has been confirmed that the compatibility between the flux and the resin composition is better in the electronic devices of the examples than in the electronic devices of the comparative examples. In addition, it has been confirmed that the adhesiveness between the cured product of the resin composition and the printed circuit board is better in Examples 1 to 24 than in Comparative Examples 1 to 46.

As is evident from the above results, the method for manufacturing an electronic device in Examples 1 to 24 can improve the productivity and manufacturing stability of an electronic device.

The present application claims a priority based on Japanese Patent Application No. 2018-078315 filed on Apr. 16, 2018, the entire disclosure of which is incorporated into the present specification.

The invention claimed is:

1. A method for manufacturing an electronic device including a base material that has an exposed metal portion over a surface of the base material and an electronic component that is provided over the base material, the method comprising:

a flux treatment step of treating the exposed metal portion with a flux by bringing the exposed metal portion into contact with the flux; and an introduction step of introducing a resin composition such that the resin composition comes into contact with a surface of the exposed metal portion treated with the flux after the flux treatment step, wherein the flux contains a rosin, an activator, and a solvent, wherein a content of the rosin is equal to or greater than 1 part by mass and equal to or smaller than 18 parts by mass with respect to 100 parts by mass of the flux, wherein a percent change in mass of the flux that is measured before and after a heating treatment by the following procedure is equal to or lower than 21% by mass, wherein, when a heating treatment is performed on the flux in a nitrogen atmosphere under a heating condition in which the flux is heated to 250° C. from 25° C. at a heating rate of 10° C./min, a mass M1 of the flux before the heating treatment and a mass M2 of the flux after the heating treatment are measured using a thermogravimetric analyzer, and then a percent change in mass of the flux before and after the heating treatment is calculated based on Equation: $(M2/M1) \times 100$ by using the obtained M1 and M2, wherein the resin composition contains an epoxy resin and a phenolic resin curing agent, and wherein the resin composition satisfies a relational expression of $Mn1 \leq 210 \times SP1 - 4,095$ between SP1 and Mn1, wherein SP1 represents a Hansen's method-based average solubility parameter of a resin group consisting of the epoxy resin and the phenolic resin curing agent in the resin composition, and wherein Mn1 represents a number average molecular weight of the resin group consisting of the epoxy resin and the phenolic resin curing agent.

2. The method for manufacturing an electronic device according to claim 1, wherein in the resin composition, SP1 is equal to or higher than 20.8 $[cal/cm^3]^{0.5}$ and equal to or lower than 30.0 $[cal/cm^3]^{0.5}$.

3. The method for manufacturing an electronic device according to claim 1, wherein in the resin composition, Mn1 is equal to or higher than 250 and equal to or lower than 550.

4. The method for manufacturing an electronic device according to claim 1, wherein in the resin composition, SP1 and Mn1 satisfy $210 \times SP1 - 5,000 \leq Mn1$.

5. The method for manufacturing an electronic device according to claim 1, wherein a content of the epoxy resin in the resin composition is equal to or greater than 2 parts by mass and equal to or smaller than 20 parts by mass with respect to 100 parts by mass of a total solid content of the resin composition.

6. The method for manufacturing an electronic device according to claim 1,
wherein a content of the phenolic resin curing agent in the resin composition is equal to or greater than 2 parts by mass and equal to or smaller than 20 parts by mass with respect to 100 parts by mass of a total solid content of the resin composition.

7. The method for manufacturing an electronic device according to claim 1,
wherein the epoxy resin is one kind of epoxy resin or two or more kinds of epoxy resins selected from the group consisting of a biphenyl-type epoxy resin, a polyfunctional epoxy resin, a phenol aralkyl-type epoxy resin, and a bisphenol-type epoxy resin.

8. The method for manufacturing an electronic device according to claim 1,
wherein the resin composition further contains a filler.

9. The method for manufacturing an electronic device according to claim 8,
wherein in a volume-based particle size distribution of the filler in the resin composition, a particle size $D_{50}$, at which a cumulative volume of the filler is 50%, is equal to or greater than 0.1 μm and equal to or smaller than 50 μm.

10. The method for manufacturing an electronic device according to claim 8,
wherein a content of the filler in the resin composition is equal to or greater than 70 parts by mass and equal to or smaller than 95 parts by mass with respect to 100 parts by mass of a total solid content of the resin composition.

11. The method for manufacturing an electronic device according to claim 1,
wherein the resin composition further contains a coupling agent.

12. The method for manufacturing an electronic device according to claim 11,
wherein the coupling agent contains aminosilane.

13. The method for manufacturing an electronic device according to claim 1,
wherein the activator in the flux contains an organic acid or an amine.

14. The method for manufacturing an electronic device according to claim 13,
wherein the amine contains imidazole or benzotriazole.

15. The method for manufacturing an electronic device according to claim 1, further comprising:
preparing the electronic component having solder bumps;
subsequently attaching the flux to the solder bumps in the flux treatment step;
then electrically connecting the electronic component and the exposed metal portion of the base material through the solder bumps;
and then introducing the resin composition into a space between the base material and the electronic component and into the periphery of the electronic component in the introduction step and performing a heating treatment.

16. The method for manufacturing an electronic device according to claim 15,
wherein the introduction step of introducing the resin composition is performed after the flux treatment step without cleaning the flux attached to the solder bumps with a solvent.

17. The method for manufacturing an electronic device according to claim 1,
wherein the exposed metal portion is a metal circuit portion.

18. The method for manufacturing an electronic device according to claim 1,
wherein the base material is constituted with an inorganic substrate or an organic substrate.

19. The method for manufacturing an electronic device according to claim 1,
wherein the resin composition is a thermosetting resin composition.

* * * * *